(12) United States Patent
Ollendorf et al.

(10) Patent No.: US 7,300,875 B2
(45) Date of Patent: Nov. 27, 2007

(54) POST METAL CHEMICAL MECHANICAL POLISHING DRY CLEANING

(75) Inventors: Heinrich Ollendorf, Richmond, VA (US); Stacey Cabral, Richmond, VA (US); Robert Fuller, Mechanicsville, VA (US)

(73) Assignee: Infineon Technologies Richmond, LP, Munich (DE)

( * ) Notice: Subject to any disclaimer, the term of this patent is extended or adjusted under 35 U.S.C. 154(b) by 151 days.

(21) Appl. No.: 10/777,608

(22) Filed: Feb. 11, 2004

(65) Prior Publication Data

US 2005/0227471 A1    Oct. 13, 2005

(51) Int. Cl.
*H01L 21/302* (2006.01)
(52) U.S. Cl. .............................. 438/692; 257/E21.215
(58) Field of Classification Search .................... 438/6, 438/10, 104, 107–114, 118, 121–123, 128–129, 438/135, 142, 145, 149, 151, 157, 176, 478, 438/184, 193, 195–198, 200–203, 206–207, 438/209–211, 218, 237, 165, 294, 308, 337, 438/353, 106, 127, 199, 212, 229, 231–234, 438/262, 299, 301, 305–306, 455, 458–460, 438/464–465, 584–586, 588, 597–599, 612, 438/618, 622
See application file for complete search history.

(56) References Cited

U.S. PATENT DOCUMENTS

| | | | | |
|---|---|---|---|---|
| 6,020,639 A | * | 2/2000 | Ulrich et al. | ................ 257/750 |
| 6,114,243 A | * | 9/2000 | Gupta et al. | ................ 438/687 |
| 6,153,526 A | * | 11/2000 | Shih et al. | ................ 438/692 |
| 6,153,530 A | * | 11/2000 | Ye et al. | ................ 438/720 |
| 6,350,694 B1 | * | 2/2002 | Chang et al. | ................ 438/692 |
| 6,395,635 B1 | * | 5/2002 | Wang et al. | ................ 438/692 |
| 6,413,870 B1 | * | 7/2002 | Gambino et al. | ................ 438/692 |
| 6,465,345 B1 | | 10/2002 | Nogami et al. | |
| 6,468,817 B2 | * | 10/2002 | Nakabayashi et al. | ........ 438/14 |
| 6,548,409 B1 | * | 4/2003 | Lee et al. | ................ 438/692 |
| 6,723,144 B2 | * | 4/2004 | Katagiri et al. | ................ 51/308 |
| 6,818,557 B1 | * | 11/2004 | Ngo et al. | ................ 438/687 |
| 7,012,335 B2 | * | 3/2006 | Lee et al. | ................ 257/758 |
| 7,084,063 B2 | * | 8/2006 | Noguchi et al. | ............ 438/691 |
| 2002/0042193 A1 | * | 4/2002 | Noguchi et al. | ............ 438/618 |
| 2004/0248409 A1 | * | 12/2004 | Padhi et al. | ................ 438/653 |

OTHER PUBLICATIONS

Kelly H. Block, Heather L. Rayle, "Integration of CMP with Low-k Materials", Semiconductor International, Entegris, Reed Business Information, a division of Reed Elsevier Inc., (Jun. 1, 2002), 7 pages.

(Continued)

*Primary Examiner*—Michael Lebentritt
*Assistant Examiner*—Andre' Stevenson
(74) *Attorney, Agent, or Firm*—Brinks Hofer Gilson & Lione (57) ABSTRACT

Metal residue on a semiconductor surface resulting from metal chemical mechanical polishing ("CMP") process are eradicated using a dry clean process. The dry cleaning uniformly removes or substantially eliminates metal residue from the surface of the semiconductor. An unintended metal short that may be present due to the residue may thereby be eliminated by adjusting the dry cleaning process based on a type of dry cleaning material, and type and a thickness of the residue.

14 Claims, 5 Drawing Sheets

OTHER PUBLICATIONS

Maria A. Lester, Associate Editor, "Post-CMP Cleaning Enhanced on Ploy-Si Film", Semiconductor International, Focus Dry, Reed Business Information, a division of Reed Elsevier Inc., (Jul. 1, 2002), 2 pages.

Souvik Banerjee, Andrea Via, Harlan F. Chung, Robert J. Small, "Combining Aqueous and Cryogenic Post-CMP Cleaning", Semiconductor International, Solid State Equipment Corporation, Reed Business Information, a division of Reed Elsevier Inc., (Feb. 1, 2003), 7 pages.

Michael R. Oliver, "Chemical Mechanical Polishing", Semiconductor International, ASML, Reed Business Information, a division of Reed Elsevier Inc., (Jun. 1, 2003), 2 pages.

* cited by examiner

POST METAL CHEMICAL MECHANICAL POLISHING DRY CLEANING

BACKGROUND OF THE INVENTION

1. Technical Field

This invention relates generally to semiconductor integrated circuit devices. More particularly, this invention relates to dry cleaning post metal chemical mechanical polishing of integrated semiconductor devices and the integrated semiconductor devices fabricating therefrom.

2. Related Art

Design improvements are being made for modern families of semiconductor integrated circuits (IC's). An overall size of the IC may be reduced by employing smaller devices that make up the IC as well as layout improvements that provide for tighter packing or increased density of those devices. By increasing the density of the IC, the IC will occupy less space on a die on which the IC is laid out, and therefore, more dies can be cut from a single wafer. Increased density also may result in increased speed of the IC, reduced manufacturing costs for the IC, and reduced costs of equipment employing such an IC.

IC's commonly employ millions to billions of electronic components such as transistors, diodes, conductive interconnecting lines, and resistive and capacitive regions. Multiple IC's may be laid out on a die. Multiple dies may be laid out on the wafer. The IC may include multiple levels of electronic components where a planar interlevel dielectric (ILD) layer is formed between the various levels to electrically isolate the layers and the components therein. A trench may be formed in an ILD to form an interconnect between layers.

A process for planarizing the ILD, referred to as a chemical mechanical polishing (CMP) process, includes using a polishing tool, a pad and a slurry in a sequence of steps to planarize a surface of the wafer and/or to remove undesired materials from the surface of the wafer. The polishing pad is coupled with the polishing tool. The pad is applied to the surface of the wafer. The polishing pad applies the polishing slurry against the surface of the wafer. The pad and slurry are traversed across the surface of the wafer, generally by rotating the pad with respect to the surface of the wafer. The slurry may include polishing agents or chemical abrasives that remove undesired materials from the wafer and form a planar surface.

In a process referred to as a damascene sequence, trenches are etched into a oxide surface to form lines or locations where metal material is desired. The trenched oxide layer may be back-filled with the desired metal material such as tungsten. The trenched oxide layer is filled with the metal material so that the metal material fills the trenches as well as a layer above the oxide layer. The CMP process is used to polish the surface to oxide layer to remove substantially all metal material from the surface of the oxide layer and leaving the metal material substantially only in the trenches. The metal in the trenches forms the metal pattern in the oxide.

A problem with metal CMP processes, for example in the damascene sequence, is the generation of a micro-scratch or a small trench in the surface of the wafer. During the CMP process, the metal material may be smeared into the micro-scratch leaving a residue of metal material in the micro-scratch. The residue of metal material may affect an unintended trench that crosses the metal pattern. The unintended trench may create a short between lines in the metal pattern. The trench also may create leakage currents between components or may cause an early life time failure of the IC. Subsequent processes that address concerns introduced by residue-filled micro-scratches increase the cost of the IC and/or decrease the yield for the IC. Accordingly, there is a need for a process post metal CMP to remove residue filled micro-scratches.

BRIEF SUMMARY

The above problems have been solved with the present invention. By way of introduction only, an advantage of the present invention is to reduce or eliminate effects of residue-filled micro-scratches in a semiconductor integrated circuit ("IC") device.

An unintended result of a metal chemical mechanical polish ("CMP") process is a creation of a micro-scratch into which a residue of metal material may be smeared. The residue-filled micro-scratch creates a short or multiple shorts across the IC and may cause an early life failure of the IC or components of the IC. A dry clean process after a metal chemical mechanical polish ("CMP") in the fabrication of the IC is performed to substantially reduce or eliminate altogether residue-filled micro-scratches.

The dry clean process may include dry-cleaning a post CMP semiconductor wafer or a semiconductor integrated circuit ("IC"). The semiconductor wafer or IC may be exposed to plasma which reacts with the metal of the semiconductor wafer or IC. The plasma reacts with the metal in a manner in which the metal material may be uniformly removed at a known rate over time. The removed metal includes material from an intended metal pattern as well as material that includes the metal residue in a micro-scratch.

The semiconductor wafer or IC is exposed to the plasma for an amount of time sufficient to remove a thickness of the metal residue in a micro-scratch, thereby removing an electrical short caused by the presence of the residue in the micro-scratch. Although metal material of an intended metal pattern also may be removed, a sufficient amount of metal will remain. The type of plasma may be selected based on the type of metal to be removed and to effect a rapid removal of residue metal.

The metal CMP process may be used in a damascene sequence where micro-scratches or small trenches may be unintentionally formed across the metal pattern of an IC. By exposing the residue-filled micro-scratch to plasma suitable to remove the metal material, the residue will react with the plasma to create a volatile gas that may result in the residue vacating the micro-scratch. The residue in the micro-scratch thereby may be reduced to an acceptable level, substantially eliminated or removed altogether.

A carbon-fluoride ($CF_4$) plasma or other etching fluorine gas combinations such as $NF_3$, $CHF_3$, and $C_4F_6$ may be used for tungsten or copper materials used metal CMP process. Bromine and Chlorine chemistries also may be selected according to the type of metal used in the IC.

The invention may be used with any type or form of IC in which a metal CMP process may be performed during the fabrication of the IC. Such IC's include electronic memory devices, such as random access memory (RAM), dynamic random access memory (DRAMs), or synchronous dynamic random access memory (SDRAM), processors, logic gates, application specific integrated circuits, and combination thereof, or the like. The invention may be used in conjunction with any of variety of IC fabrication methods, techniques or processes. The present invention also may be used to planarize a dielectric layer, a metal layer, including lines and vias, in a damascene or dual damascene sequence.

The foregoing discussion of the summary is provided only by way of introduction. Other systems, methods, features and advantages of the invention will be, or will become, apparent to one with skill in the art upon examination of the following figures and detailed description. It is intended that all such additional systems, methods, features and advantages be included within this description, be within the scope of the invention, and may be realized and obtained by means of the instrumentalities and combinations particularly pointed out in the claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENT

Figure 1:
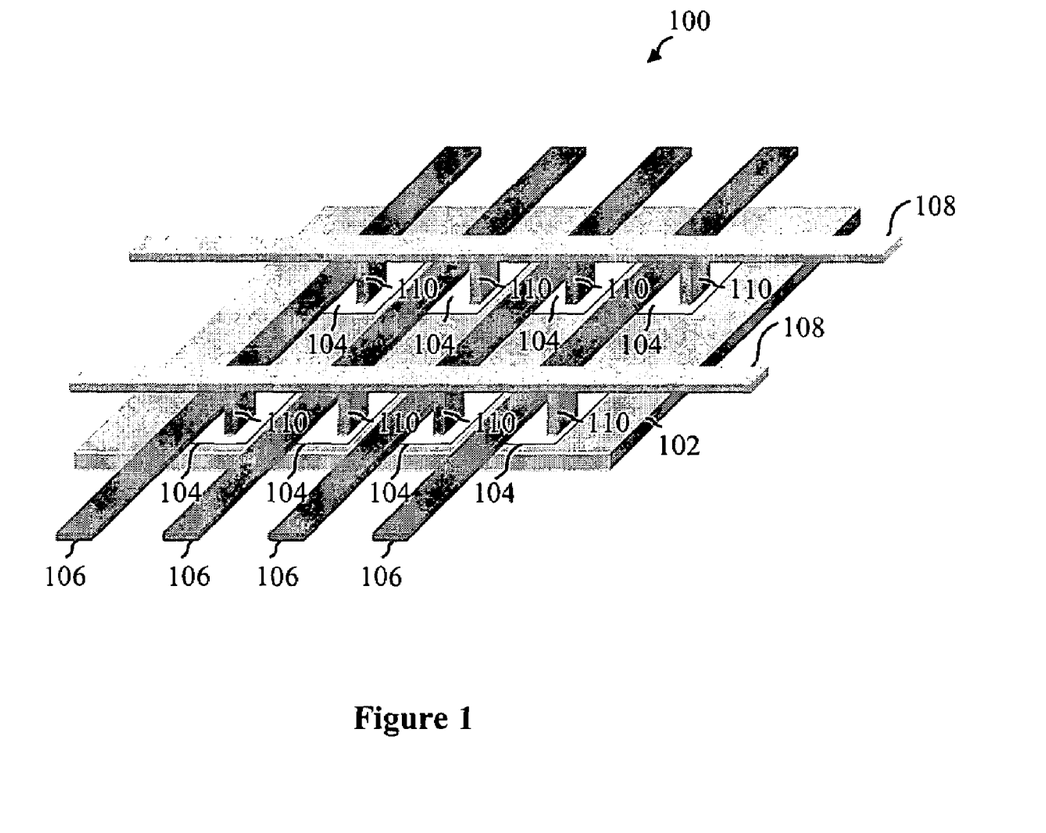
FIG. 1 is a perspective view of a portion of a semiconductor integrated circuit.

FIG. 1 illustrates an example of a portion of a semiconductor integrated circuit ("IC") 100. The IC 100 may be any semiconductor integrated circuit device, including electronic memories, processors, controllers, application specific devices, diodes, triodes, logic gates, amplifiers, capacitive devices, resistive devices, inductive devices, any combination thereof, or the like. The IC 100 may be formed from any of a variety of fabrication techniques, methods or processes such as deep trench fabrication, shallow trench isolation, polysilicon film, photoresist, any combination thereof or the like. The IC 100 may include conductive layers, semiconductor elements such as transistors and diodes and dielectric layers. The IC 100 may include semiconductor materials such as GaAs, SiGe, SiC, any combination thereof or the like.

The IC 100 of FIG. 1 illustrates a portion of an exemplary electronic memory or memory array. The memory may be a random access memory (RAMs), a dynamic random access memory ("DRAM"), or synchronous dynamic random access memory (SDRAM), or the like. The IC 100 includes multiple memory units 104. Each memory unit 104 may include one or more electronic components that electronically store data.

The memory units 104 are formed in a substrate material 102. The substrate may be a silicon substrate, silicon on insulator substrate, silicon on sapphire substrate, glass substrate, ceramic substrate, gallium arsenide substrate and metallized substrate. The memory units 104 are arranged in rows and columns, or any configuration that may provide for maximization of available space on the substrate material 102 or within the IC 100.

Each memory unit 104 is electrically connected to a wordline 108 and a bit line 106. A memory unit 104 is accessed via an associated wordline 108 and data stored by the memory unit 104 is read from the corresponding bitline 106. Multiple memory units 104 (collectively a "Word") are read by accessing the wordline 108 to which multiple memory units 104 are coupled. The data stored in each memory unit 104 coupled to the accessed wordline 108 is read from the corresponding bitline 106. The wordline 108 may correspond to a row of the memory array and the bitline 106 may correspond to a column of the memory array. The wordline 108 and bitline 106 are conductive elements that cross the memory array.

The IC 100 includes various insulating layers (not shown). The insulating layer may include an oxide material that provides insulating properties. The insulating layers electrically isolate components of the IC 100, such as the wordlines 108, bitlines 106 and the substrate material 102. These insulators are not shown in the figures so as not to unduly complicate the drawing.

Figure 2:
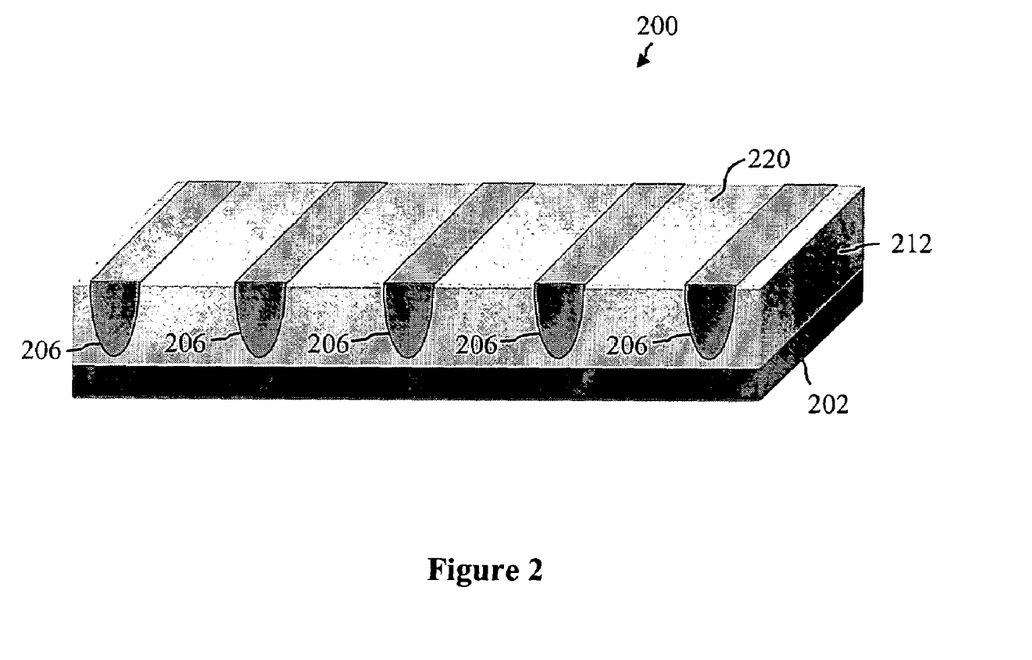
FIG. 2 is a perspective view of a metal layer pattern of the portion of the semiconductor integrated circuit of FIG. 1.

FIG. 2 illustrates an example of a portion of semiconductor IC 200. The IC 200 includes a substrate material 202, a dielectric material 212. The dielectric material 212 may have a surface 220. The IC 200 may start with the substrate material 202 on which the dielectric material 212 may be formed. The substrate 202 may be similar to the substrate 102 of FIG. 1. The dielectric material 212 may be formed on the substrate 202. The dielectric 212 may be an oxide such as SiO or other doped or undoped oxides.

A pattern may be formed in the dielectric material 212 as the basis for a patterned layer of the IC 200. The pattern may include trenches that form one or more lines 206 of the layer of the IC 200. The pattern also may include one or more interconnects, vias or other openings (not shown) in the dielectric material 212. The lines 206, interconnects, vias or other openings in the dielectric are formed to a predetermined depth range.

The pattern in the dielectric material 212 may be formed using any suitable method, technique or process for forming a pattern in a semiconductor. Such techniques include conventional lithography techniques, damascene sequences, dual damascene sequences, and etching techniques that form deep trenches 206 in a desired location in the dielectric material 212. The trenches 206 may have a depth in the range 100 nm to 200 nm deep. The trenches may be formed at an edge-to-edge distance in the range of 100 nm to 150 nm, or smaller distances. In an embodiment, the trenches are formed in the dielectric material using a damascene sequence.

A conductive material may be back-filled over the dielectric material 212. Back-filling the dielectric material 212 fills the lines 206 and forms a conductive pattern in the dielectric material 212. The conductive material may be a conductive metal, such as tungsten, copper, aluminum, copper alloy, aluminum alloy or other metal materials suitable for semiconductor applications. As a result of the back-filling procedure, remnants of the conductive material may remain at or on the surface 220. Together, the lines 206, interconnects, vias or other openings in the dielectric may form a layer of the IC 200. The metal may be any conductive material suitable for semiconductor applications.

The surface 220 may be prepared using a chemical mechanical polishing (CMP) process. The CMP process may be used to planarize the surface 220 and/or to remove undesired material from the surface 220. In general, the CMP process includes using a polishing pad attached to a polishing tool to apply polishing slurry to the surface 220. The pad applies the slurry to the surface 220 with pressure and moves the slurry across the surface to remove undesired material and/or planarize the surface 220. The CMP process, for example, may be used to remove the excess or remnant conductive material that may be present on surface 220 after a back-filling of the material. The polishing pad may be rotated and or traversed across the surface 220 to engage the polishing slurry with the surface 220. The polishing slurry may contain polishing agents or chemicals that are known to remove the undesired materials from the surface. The planarized surface 220 may be further processed for additional layers comprising the IC 200.

Figure 3:
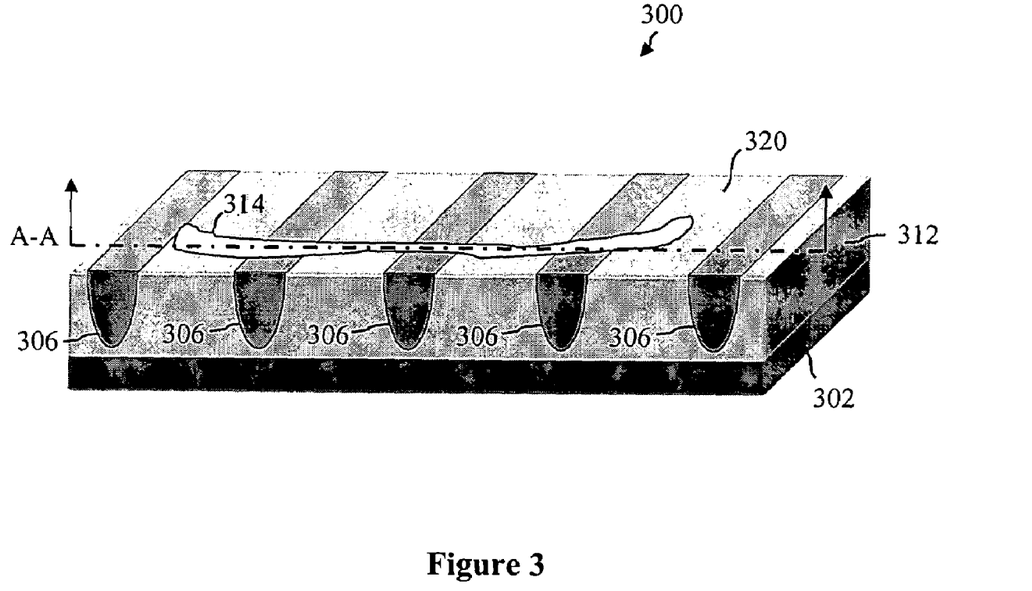
FIG. 3 is a perspective view of the metal layer pattern of the semiconductor integrated circuit of FIG. 2 having a residue filled micro-scratch, and illustrating sectional line A-A.

FIG. 3 illustrates a perspective view of an IC 300 following a metal CMP process. The IC 300 includes a top surface 320, a substrate 302, a dielectric material 312, and a metal pattern formed in the dielectric material 312. FIG. 3 also illustrates sectional line A-A, which crosses the IC 300 through a scratch 314. The scratch 314 may have a random or arbitrary pattern at the surface. The scratch 314 may be located at the surface 320 and may have a depth (d) into the IC.

The scratch may be an unintended result of processing of the surface 320. For example, the scratch 314 may be effected during planarizing of the surface 300. The scratch may be formed in the dielectric material 312 and across the metal pattern at the surface 320 as an unintended result of a CMP process on the surface 320. The CMP process may smear the conductive metal material of the metal filled trenches 306 into the 314 such that the scratch is filled, at least in part with residue metal material. The scratch 314, therefore, may form an unintended metal residue-filled trench that crosses the metal pattern in a random or arbitrary pattern. The scratch 314 creates an unintended conductive path, or short, between adjacent metal trenches 306, or other components of the IC that are to be electrically isolated. The short may result in an unusable portion of the IC 300, which may be detected during early testing of the IC 300. When the short is detected, a problem introduced by the short may be remedied in an appropriate manner.

The metal residue-filled scratch also may cause an early life failure due to a breakdown in the dielectric material 312 between the metal residue-filled scratch 314 and the metal pattern. Because the dielectric may be present in the early life of the IC, such failure may not be detected in early life testing of the IC 300. However, the dielectric breakdown may occur during the lifetime of the IC 300, and may result in a partial or complete failure of the IC 300. Such failures may minimize the reliability of the IC 300 or the lifetime reliability of the IC 300.

Figure 4:
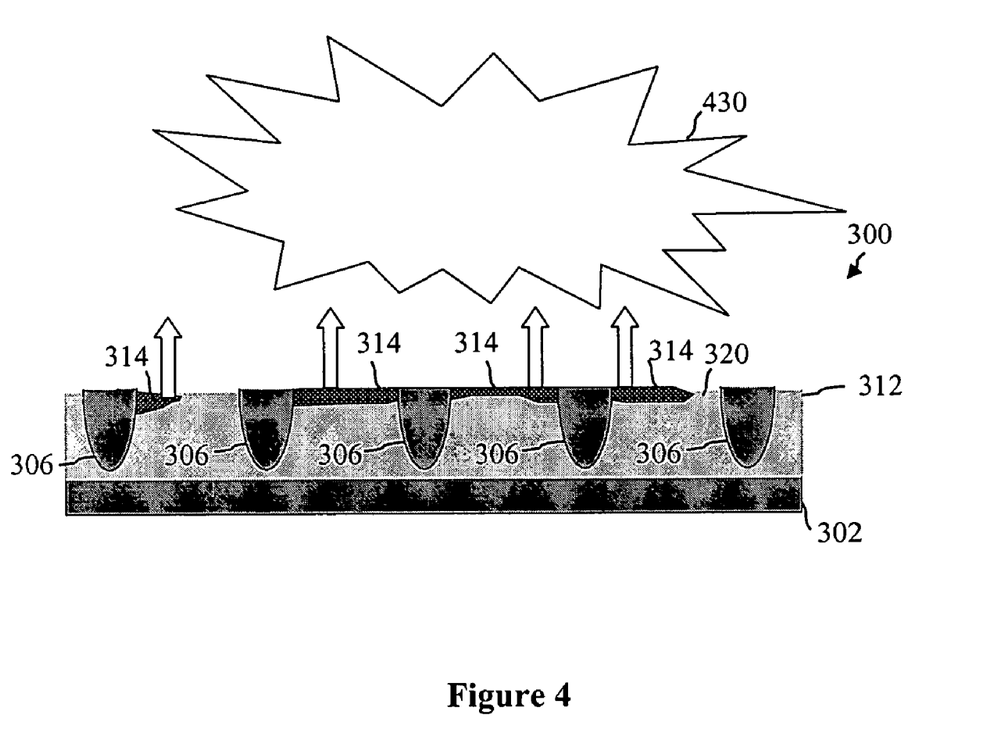
FIG. 4 is a cross-section view along sectional line A-A of the metal layer pattern of the semiconductor integrated circuit of FIG. 3.

FIG. 4 illustrates cross-section of IC 300 through sectional line A-A. As described for FIG. 3, the metal residue-filled scratch 314 crosses the IC 300 at the surface 320. The scratch 314 intersects the lines 306 and may create an electrical path between the lines 306.

The scratch 314 has a thickness or depth (d) that varies along a length of the scratch 314. The depth (d) depends on the type of preparation that affected the scratch 314. The depth (d) is generally within a known range and may be generally less than 10% of the depth of the metal filled trenches 306. For example, the CMP process of the surface 320 may be known to form scratches in the surface 320 having a depth in the range of approximately 10 nm. A metal residue in the scratch will therefore have a depth no larger than 10 nm.

The metal residue in the scratch 314 is dry-cleaned to remove the residue. The dry-cleaning eradicates the residue in the scratch, and thereby leaves only an empty trench. By eradicating the residue, a short that is created by the presence of the conductive material in the scratch 314 is substantially eliminated. In addition, other failures such as an early life failure may be mitigated by dry-cleaning the residue from the scratch 314.

The scratch 314 is dry-cleaned to remove the residue from the scratch 314. The residue is removed by exposing the surface 320 having the scratch 314 to an environment where the residue is allowed to react with molecules in a manner in which molecules that comprise the residue vacate the scratch 314. For example, the IC 300 is exposed to plasma 430. The plasma 430 reacts with the residue on a molecular level to form a volatile gas based on the molecules of the residue and the ions of the plasma 430. The volatile gas formed by the reaction may be removed from the environment, and the plasma 430 allowed to react with the residue until all or substantially the entire residue is removed from the scratch 314.

The plasma 430 reacts with the residue at a known rate and thereby, the molecules of the residue evacuate the scratch 314 at a known rate. The surface 320, and residue-filled scratch, are exposed for a sufficient amount of time to evacuate all or substantially all material from the scratch 314. The scratch 314, or trench, remains, but the residue in the scratch will be evacuated from the scratch 314. The metal from the lines 306 also may be partially evacuated at the same rate. Since the scratch 314 is known to have approximately 10% or less depth than the depth of the lines 306, the dry-cleaning will not substantially affect electrical characteristics of the lines 306. The lines 306 have a depth that exceeds a final depth so that after the dry-cleaning, the lines will have a desired depth.

In an embodiment, the conductive material may be tungsten. The plasma 430 may be selected to include ions that are known to react with the tungsten material, such as $CF_4$ plasma. The $CF_4$ plasma 430 may be applied to the surface 320 so that a volatile gas is formed by the reaction of the $CF_4$ and the tungsten. The $CF_4$ plasma 430 reacts on a molecular level with the tungsten to form a tungsten (W) and Florine (F) containing volatile gas such as $WF_6$. The volatile gas may be removed so that the plasma/$CF_4$ interaction proceeds at a known rate to uniformly evacuate the residue from the scratch 314.

The $CF_4$ plasma 430 may be diluted with an inert gas such as $N_2$ at a ratio of 1 to 1 and may be applied to the surface 320 at a pressure in the range of 0.3 Torr with a gas flow rate of 100 sccm. The temperature of the surface 320 may be in the range from room temperature to 250° C. The surface 320 may be exposed to the $CF_4$ plasma 430 for a time sufficient to evacuate the residue from the scratch 314, based on the reaction rate $CF_4$ plasma 430 with the residue. In an embodiment, the surface 320 is exposed for approximately 10 seconds or less. Alternate plasmas may be used based on the type of residue to be evacuated. For example, $CF_4$ also may be used for copper or Br/Cl chemistries may be used for copper. Other Flourine containing gases also may be used such as $CHF_3$ end $C_4F_6$.

Figure 5:
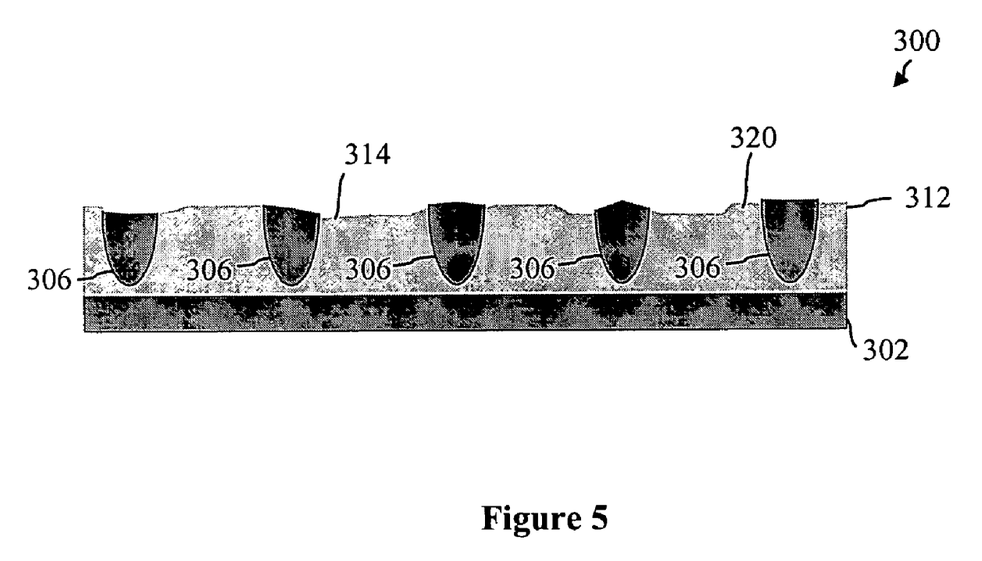
FIG. 5 is the cross-section view along sectional line A-A of the metal layer pattern of the semiconductor integrated circuit of FIG. 3 after a dry-cleaning process.

FIG. 5 shows the cross section of IC 300 along line A-A of FIG. 3 following the dry-cleaning of the surface 320 of IC 300. The residue that previously filled the scratch 314 has been evacuated from the scratch 314. In addition, a portion of the lines 306 that may have been exposed to the dry-cleaning may also have been evacuated. The IC may be further processed using known techniques, methods and processes for forming the IC Various embodiments of a post metal CMP process dry cleaning have been described and illustrated. However, the description and illustrations are by way of example only. Many more embodiments and implementations are possible within the scope of this invention and will be apparent to those of ordinary skill in the art. Characteristics for the components and processes described herein may be varied to implement a post metal CMP process dry cleaning within the scope of this invention.

For example, the post metal CMP process dry cleaning may be used in a copper damascene or dual damascene sequence. The metal CMP process may planarize Aluminum, Aluminum alloys, copper, copper alloys, tungsten, polymers, and diffusion barriers. The CMP process also may planarize both the dielectric layers and metal layers in a damascene or dual damascene process. The post metal CMP process dry cleaning may be configured to clean metal residue based on the metal residue, the type of IC and for efficient cleaning of the IC. In particular, the dry-cleaning post metal CMP process may be employed to clean an IC having tungsten interconnects formed using a damascene or dual damascene process.

While the embodiments have been described with respect to a memory array, and in particular to a portion of a memory array, those skilled in the art will recognize that the advantages may be extended to various IC's. The post metal CMP PROCESS dry cleaning may be used on various integrated circuits and with various techniques for fabricating integrated circuits. Accordingly, the invention is not to be restricted except in light as necessitated by the accompanying claims and their equivalents.

What is claimed is:

1. A method for dry-cleaning metal residue from a semiconductor surface, comprising:
    forming a metal trench pattern in a dielectric layer of a semiconductor device, the metal trench pattern having a conductive metal therein, the metal trench pattern having an edge to edge distance of 150 nm or less, the conductive metal and the dielectric layer defining a semiconductor surface;
    preparing the semiconductor surface using a chemical mechanical polish (CMP) process, the metal residue including the conductive metal smeared in an unintended scratch at the semiconductor surface;
    exposing the prepared semiconductor surface to a plasma and an inert gas, the plasma having ions reacting with the metal residue to form a volatile gas, the prepared semiconductor surface being exposed to the plasma for a predetermined range of time to directly remove the metal residue from the scratch; and
    removing the metal residue in the unintended scratch at the semiconductor surface.

2. The method of claim 1 where the step of preparing the semiconductor surface forms the metal residue in the scratch.

3. The method of claim 1 where the metal trench pattern comprises a metal material selected from the group consisting of tungsten, copper, aluminum, and aluminum alloy.

4. The method of claim 3 where the metal residue comprises the metal material of the metal trench pattern as a consequence of the CMP process.

5. The method of claim 1 where the plasma comprises any one of $CF_4$, $NF_3$, $CHF_3$, $C_4F_6$, Br and Cl.

6. The method of claim 1 where the predetermined range of time of exposure to the plasma is based on the metal residue.

7. The method of claim 1 wherein the dielectric layer is a substrate material comprising any one of a silicon substrate, silicon on insulator substrate, silicon on sapphire substrate, glass substrate, ceramic substrate, gallium arsenide substrate and metallized substrate.

8. The method of claim 1 where the scratch has a depth of less than approximately 10% of a depth of the metal trench pattern.

9. The method of claim 1 where the metal residue in the scratch has a depth of approximately 5 nanometers.

10. A method of dry-cleaning a metal residue-filled scratch in a chemical mechanical polished semiconductor surface, the semiconductor surface defining a metal trench pattern having an edge to edge distance of 150 nm or less, the chemical mechanical polishing of the surface affecting the metal residue-filled scratch, the method comprising:
    exposing the surface to a plasma, the plasma reacting with the residue to form a volatile gas, the plasma being diluted with an inert gas and having a pressure substantially in the range of 0.3 Torr, a gas flow rate of approximately 100 sccm and a temperature less than approximately 250° C.

11. The method of claim 10 where the metal trench pattern comprises any one of tungsten, copper, aluminum and aluminum alloy.

12. The method of claim 11 where the plasma comprises any one of $CF_4$, $NF_3$, $CHF_3$, $C_4F_6$, Br and Cl.

13. The method of claim 12 where the surface is exposed to the plasma for approximately 10 seconds.

14. The method of claim 12 where the scratch has a depth of less than 10% of a depth of the metal pattern.

* * * * *